United States Patent [19]

Schaefer

[11] Patent Number: 5,257,233
[45] Date of Patent: Oct. 26, 1993

[54] LOW POWER MEMORY MODULE USING RESTRICTED RAM ACTIVATION

[75] Inventor: Scott Schaefer, Boise, Id.

[73] Assignee: Micron Technology, Inc., Boise, Id.

[21] Appl. No.: 608,125

[22] Filed: Oct. 31, 1990

[51] Int. Cl.⁵ ............................................. G11C 7/00
[52] U.S. Cl. .............................. 365/227; 365/230.03; 365/193
[58] Field of Search .................... 365/227, 229, 230.03, 365/230.06, 193

[56] References Cited

U.S. PATENT DOCUMENTS

| | | | |
|---|---|---|---|
| 4,151,611 | 4/1979 | Sugawara et al. | 365/227 |
| 4,881,205 | 11/1989 | Aihara | 365/227 X |
| 4,881,206 | 11/1989 | Kadono | 365/227 |

Primary Examiner—Joseph A. Popek
Attorney, Agent, or Firm—Stanley N. Protigal

[57] ABSTRACT

A memory module for an electronic device is disclosed which provides means for reducing the amount of power necessary to access a desired number of data bits. This provides a design of memory modules which requires fewer DRAMs to be turned on during a read or write cycle than present module designs, thereby using much less power.

9 Claims, 4 Drawing Sheets

| AR9 | AC9 | RASA | RASB | RASC | RASD |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

*TABLE 1*

| AR9 | AC9 | RAS1 RAS5 RAS9 RAS13 | RAS2 RAS6 RAS10 RAS14 | RAS3 RAS7 RAS11 RAS15 | RAS4 RAS8 RAS12 RAS16 |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

*TABLE 2*

| $\overline{WE}$ | $\overline{RAS}$ | $\overline{WE}$ (out) |
|---|---|---|
| 0 | 0 | 0 |
| 0 | 1 | 1 |
| 1 | 0 | 1 |
| 1 | 1 | 1 |

TABLE 3

LOW POWER MEMORY MODULE USING RESTRICTED RAM ACTIVATION

FIELD OF THE INVENTION

This invention relates to packaging configurations for integrated circuit devices (ICs). The packaging configuration is directed to logic arrays such as memory modules for computers or other electronic devices. More specifically, it describes an improvement to the design of memory modules which requires fewer DRAMs to be turned on during a read or write cycle than present module designs, thereby using less current.

BACKGROUND OF THE INVENTION

Current generation single in-line memory modules (SIMMs) for certain brands of computers use eight one-megabit (1M) dynamic random access memories (DRAMs) arranged in a x1 configuration (having one data out signal), which supplies the computer with one megabyte (MB) of memory. Since the DRAMs are arranged in a x1 configuration, one data bit can be extracted from each chip at a time. When a module with eight 1Mx1 DRAMs is installed in a computer capable of handling eight bits of data at a time (i.e. an 8-bit computer), it accesses all eight DRAMs on a module simultaneously, thereby receiving the eight bits of data it is capable of handling. In 16-bit computers, modules containing eight 1Mx1 DRAMs are installed in groups of two in the computer. To obtain the 16 bits of data the computer is capable of handling, all 16 DRAMs are accessed simultaneously, and the computer receives one bit of data from each DRAM for a total of 16 data bits. Each time a 1Mx1 DRAM is accessed, it requires about 80 mA of current to be supplied. To access the 16 DRAMs simultaneously requires approximately 640 mA of current per module, or 1,280 mA total.

Some SIMMs use 1Mx4 DRAMs, with each DRAM having four bits of data. A module using two 1Mx4 chips supplies 1MB of memory, as does a module using eight 1Mx1 chips. A module with two 1Mx4 devices is functionally equivalent to a module using eight 1Mx1 devices, but has fewer parts, thereby being easier to assemble and somewhat more reliable due to fewer solder joints. There is not much power savings using a module with two 1Mx4 DRAMs over a module using eight 1Mx1 DRAMs, as all the devices on either module are turned on each time one of the devices is accessed in order to access eight data bits, and to access two 1Mx4 DRAMs requires about as much power as accessing eight 1Mx1 DRAMs.

In most computers, addressed words are an even number of bits, such as eight, sixteen or thirty two bits. This fits neatly into memory array blocks which use x4 chips. This convenient arrangement is complicated by the fact that a system of memory parity has proven to be very effective in error detection. The parity is an additional bit for each word, so that an eight bit word ("byte") is addressed as nine bits, the ninth bit being parity.

Reducing power consumption in a computer or other electronic device is a design goal, as overtaxing a computer's power supply is a common concern. With the addition of modem cards, memory boards, graphics cards, hard disk controller cards, printer buffer cards, and mouse cards, the chances of burning out the computer's power supply from drawing too much current becomes a possibility. Even if the power supply is not unduly stressed, a component which uses more power than a similar component will release more heat, thereby increasing the temperature of the component as well as the inside of the computer or electronic device. Elevated temperatures within the component or within the chassis of a computer can cause other components in the computer to operate more slowly or to fail prematurely.

Reducing the amount of current used by the components in a computer is also a concern to designers of portable computers. The length of time between battery recharges for various brands and types of computers ranges from about two hours to 12 hours. Reducing the amount of current the computer uses, thereby extending the length of time the computer can be run off the battery, is a design concern as well as a marketing concern For the reasons listed above, reducing the power consumption of components installed in a computer is a goal of computer component designers and computer manufacturers.

SUMMARY OF THE INVENTION

An object of this invention is to provide a memory module design which uses less power than previous modules This object of the present invention is attained by fabricating a module using a number of memory chips, where each memory chip can be accessed independently, and where only the DRAM or DRAMs accessed is turned on while all other DRAMs remain in standby mode. A DRAM in standby mode uses much less current than activating the DRAM.

The invention can be applied to modules using DRAMs with multiple data outs (DQ's), but does not apply to modules using DRAMs in a x1 configuration. For instance, if a module supplying 1MB of memory contains eight 1Mx1 DRAMs is installed in an 8-bit computer, all eight DRAMs would have to be accessed simultaneously to supply the computer with 8 bits of data. On a 1MB module using eight 256Kx4, only two DRAMs would have to be accessed to supply the 8-bit computer with 8 bits of data.

Chips containing x16 data widths have recently been developed by Micron Technology, Inc. To manufacture these 64Kx16 DRAMs, a current generation 1M die is packaged with 16 DQ pins to provide a chip in a 64Kx16 configuration. Each of the 1,048,576 bits are uniquely addressed through the 16 address bits multiplexed on eight address lines (A0–A7) during a read or a write cycle.

A common memory configuration supplying 16 bits of data is to use two modules with each module comprising eight 1Mx1 devices. A read cycle from two of these modules, as stated previously, requires about 640 mA of current. A functional equivalent of these modules would be two modules with each module comprising eight 64Kx16 DRAMs. If these equivalent modules not comprising the invention are used, all 16 DRAMs would be turned on during a read cycle, even though the desired data comes from a single DRAM. A read would require 1280 mA of current. A module of this type comprising the invention, however, would enable only one DRAM during a read, thereby using about 90 mA of current.

When used in applications where an additional bit is used, as for parity, the additional bit may either be incorporated into the multiple data out (DQ) architecture as an additional DQ connection. Alternatively, partially operational DRAMs may be used, provided at least one good sector may be addressed A module of this type would have signals conforming to JEDEC standards or, in custom uses, to specifications specific to the intended use of the module. In any case, a module containing eight 64Kx16 devices would require one CAS line and eight RAS lines. The CAS line selects the desired column number in each of the eight DRAMs. The RAS lines are used as a bank select with each RAS line being used only by a single device, thereby accessing a row address from a single DRAM.

Figure 3:
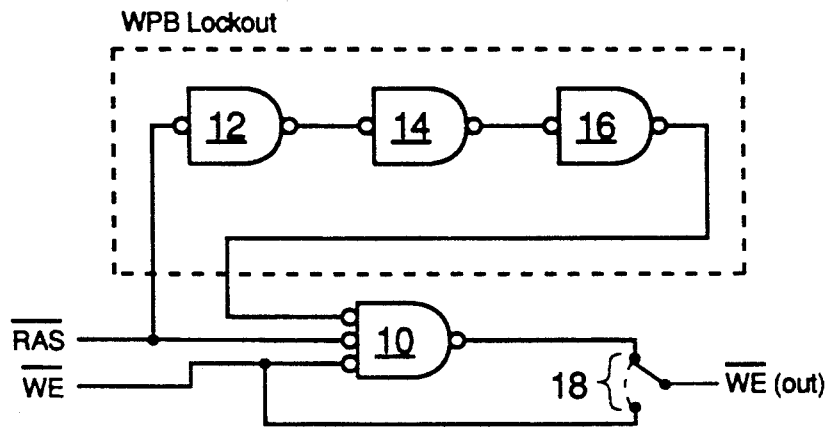
FIG. 3 shows a simple circuit which disables the write-per-bit mode of a DRAM containing multiple DQ's.

Table 1 shows the logic associated with the signals AR9 and AC9 which selects one of four groups of RAS signals;

Table 2 shows the logic associated with the signals AR8 and AC8 which selects a single DRAM from a group of four DRAMs; and Table 3 shows the logic associated with the write-per-bit lockout circuit of FIG. 3

DETAILED DESCRIPTION OF THE PREFERRED EMBODIMENT

Figure 1:
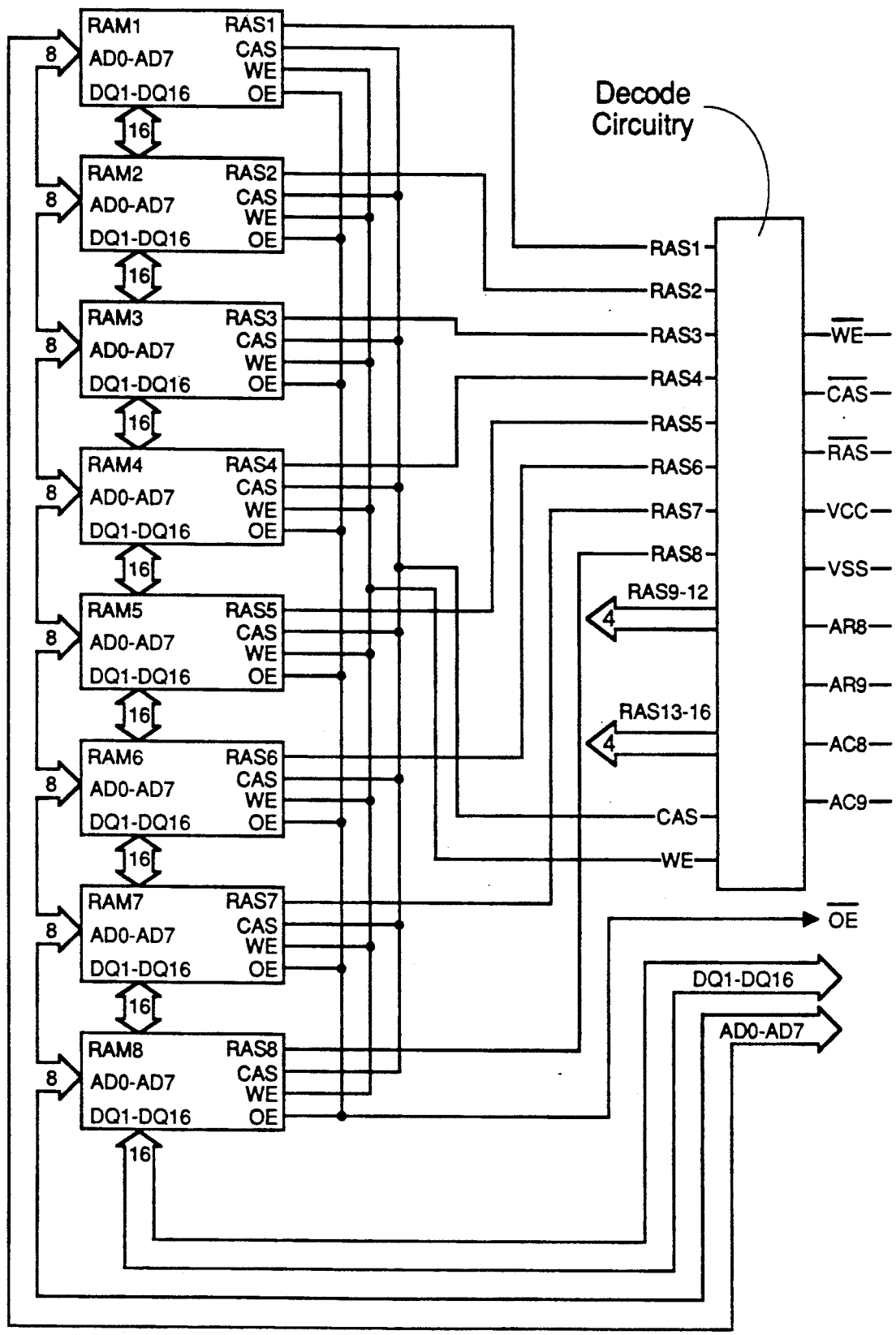
FIG. 1 shows an overview of the circuitry of the inventive module.

FIG. 1 shows an overview of the circuitry of the inventive module, including the data bus (DQ1-DQ16), the address bus (AD0-AD7), and output enable (OE). The address bus allows the computer to select individual DRAM cells to be written to or read from, while data is passed between the computer and the DRAMs along the bi-directional data bus. The OE signal controls the output buffers of the DRAM. During a READ cycle, the data is output on the data bus when the OE signal goes low.

All DRAMs share a single write enable (WE) signal, a single $V_{cc}$, a common $V_{ss}$, and a common CAS.

The signals AR8, AR9, AC8, and AC9 output by the computer to the module are altered by the decode circuitry (described below) to function as 16 RAS lines, which select one of 16 DRAMs on the module. Note that FIG. 1 shows eight RAMs; RAMs 9-16 operate in a fashion similar to RAMs 1-8, being addressed by RAS9-RAS16 as shown.

The Decode Circuitry

Following JEDEC standards, a computer or electronic device has only one RAS and one CAS input to a memory module. With only these two inputs, every time the electronic device accesses the memory, the same address on every DRAM is read or written, and as a result every device turns on. In a module comprising x1 DRAMs, this is not a problem because, as stated previously, a 16-bit computer needs to access all 16 x1 DRAMs in order to receive the 16 bits of data it is capable of handling. In a module comprising DRAMs with multiple DQ's, however, not every DRAM is accessed, but every DRAM is turned on. This requires that power be used unnecessarily.

Figure 2:
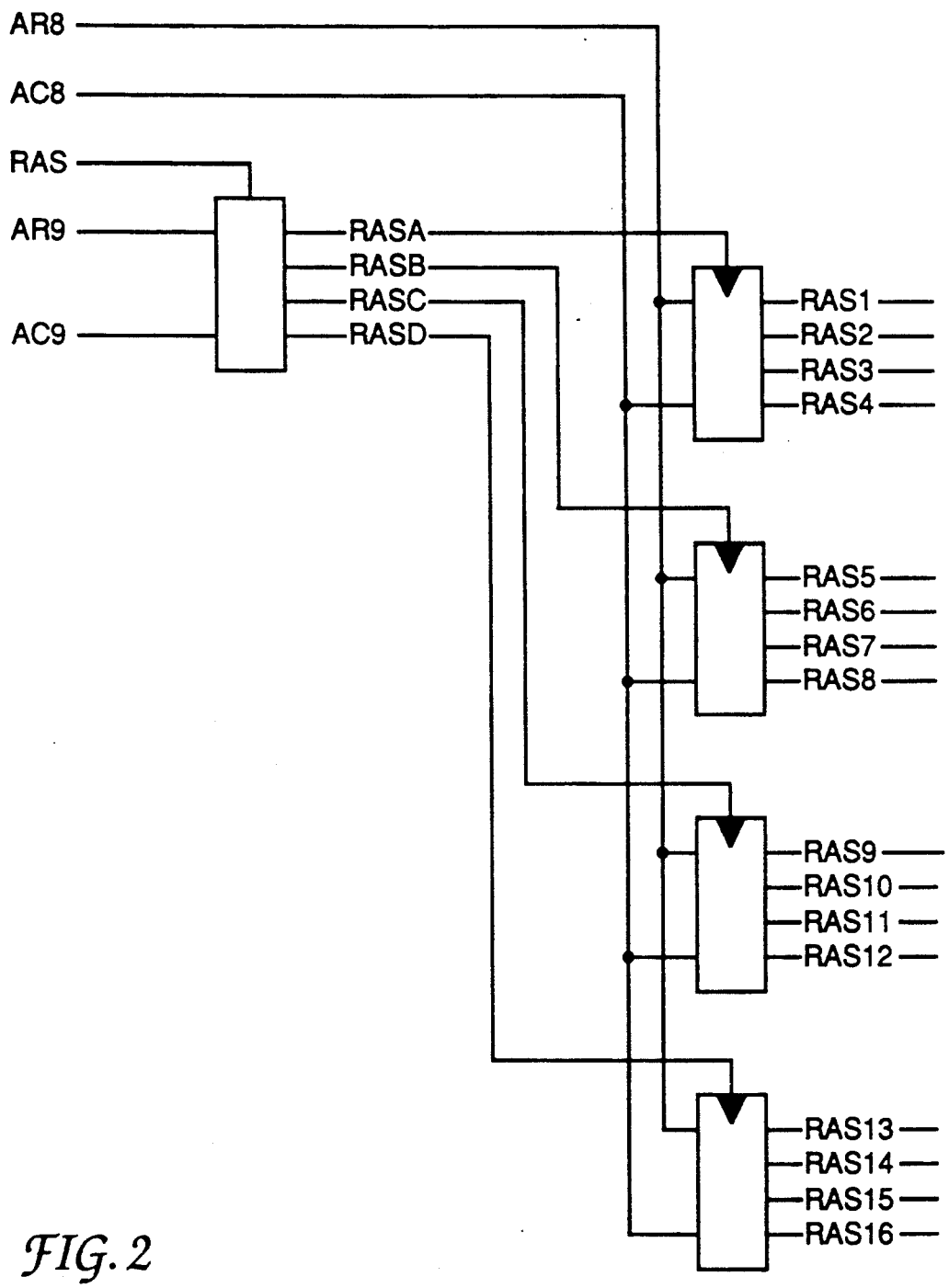
FIG. 2 details the decode circuitry of FIG. 1.

In the inventive module, turning on all the DRAMs would defeat the purpose of the invention, which is to save power by turning on only those RAMs that are accessed The decode circuitry in FIG. 2 solves this problem by using the two RAS address select bits (AR8 and AR9) and the two CAS address select bits (AC8 and AC9) output from the computer to the module in conjunction with the decode circuitry of FIG. 2 to turn on a single device As shown, the two bits input on AR9 and AC9 are used to select one of four RAS signals internal to the decode circuitry, RASA, RASB, RASC, or RASD, depending on the state of the two bits as shown in Table 1.

Each of the four groups of signals in Table 1, RASA, RASB, RASC, and RASD have four unique RAS signals as shown in FIG. 2 which are internal to the decode circuitry and are output to the DRAMs. Referring to FIG. 2, after either RASA, RASB, RASC, or RASD is turned on, the bits supplied on AR8 and AC8 are used to select a single location from RAS1 through RAS16, each RAS line corresponding to a unique DRAM (not shown). Table 2 shows the decode logic which selects a specific DRAM. As shown in FIG. 2, RASA is divided into RAS1-RAS4, RASB is divided into RAS5-RAS8, RASC is divided into RAS9-RAS12, and RASD is divided into RAS13-RAS16. So, for example, if AR9 goes high and AC9 is a low, the signal RASC goes high. Then, if both AR8 and AC8 go high, RAS12 goes high and accesses its associated DRAM, thereby leaving RAS1-RAS11 and RAS13-RAS16 unselected and the 15 DRAMs corresponding to those RAS lines in a power-conserving standby mode.

Overcoming Write-Per-Bit Mode

Write-per-bit mode is an industry standard on DRAMs having multiple DQ's. A DRAM with multiple DQ's can be written to in either a normal write mode or in write-per-bit mode. When a DRAM with more than one DQ is in a normal write mode, the number of bits corresponding to the number of DQ's are written at the same time. On a x16 device, for example, the chip logic begins writing one bit of data onto each of the 16 DQ's at the falling edge of CAS or WE (whichever is later) as long as RAS is low. (During a normal write, the status of WE is a "don't care" when RAS initially goes low.) The address signals, RAS, and CAS then toggle to select the proper address to be written to, and the desired data is input through the Data In (Din) signals.

During a write-per-bit (also called a "masked write"), any combination (or even all) of the 16 bits can be written to without writing to any of the other locations. To set up a write-per-bit signal, WE goes low. Next, the data for the "mask" is set on the DQ's, with a logic 1 corresponding to "write" and a logic 0 corresponding to a "don't write" (the mask data simply indicates which of the locations are to be written, and which are to be left unaltered). After the data for the mask is set, RAS drops, and the mask information on the data lines is changed to the desired data to be written to the selected locations Finally, when CAS is pulled low, the write begins. The address signals, RAS, and CAS toggle to input the data into the correct addresses As can be seen from the above, users of memory modules which contain x1 DRAMS which don't use write-per-bit mode may consider WE a "don't care" as RAS goes low, and allow WE to toggle. Depending on the state of the other signals, the unwary user may put the module containing DRAMs with multiple DQ's into write-per-bit mode (which, as previously stated, occurs at the DRAM level if RAS goes low when WE is low).

The simple circuit of FIG. 3, if incorporated into the decode circuitry of the module or into the design of the electronic device using the inventive module, will make the WE signal a don't care except when RAS is low, thereby preventing the chips on the modules from entering write-per-bit mode. The circuit incorporates a three input NAND gate 10. RAS, WE, and a RAS signal delayed by the three NAND gates 12, 14, 16 as shown in FIG. 3 are inverted, input to the NAND gate 10, and output as WE(out) (Note that three NAND gates is not an absolute—the number of NAND gates is determined only by the delay required to ensure that WE does not go low until after RAS goes low.) The truth table for the circuit of FIG. 3 is shown in Table 3.

A jumper, electronic switch, or a functional equivalent 18 incorporated into the circuit would allow users who desire the write-per-bit mode to disable the circuit, thereby enabling write-per-bit mode to the DRAMs.

While a preferred embodiment of the invention has been disclosed, various modes of carrying out the principles described herein are contemplated as being within the scope of the following claims. Any memory module comprising RAMs (SRAMs, DRAMs, etc.) having multiple DQ's could have a power savings by using the invention. For instance, in 1MB module comprising eight 256Kx4 RAMs, all eight DRAMs are turned on for each read, even though the 16 bits of data are received from only four of the DRAMs. The description of the invention could be easily modified by those skilled in the art for a x4 module.

In addition, modules with data widths other than those which are a multiple of four are possible with the addition of another device, such as a x1 device. For example, a x17 module is possible on a module containing 64Kx16 devices with the addition of a 64Kx1 device. Note that this device would require another RAS line, but would use the common CAS signal, and at least two devices would be turned on simultaneously to access the 17 bits of data required, one x16 DRAM for the 16 data bits, and the x1 device for the parity bit.

Finally, the described invention doesn't necessarily pertain only to memory supplied in module form. The invention would work equally well with memory placed directly on the motherboard (embedded memory) or with any other memory addressed by the computer.

It is therefore understood that the scope of the invention is not to be limited except as otherwise set forth in the claims.

I claim:

1. A logic array for storing bits of information comprising:
   a) a plurality of storage devices wherein each storage device comprises multiple data out signals and a plurality of subarrays, the number of subarrays on each storage device corresponding to the number of data out signals on said storage device, and each subarray comprising a plurality of storage locations wherein each storage location in one of said subarrays has a unique coordinate, said coordinates repeated across subarrays and across storage devices, wherein accessing data from said storage locations results in a significant increase in consumption of current by that storage device;
   b) means for accessing a selected number of said storage devices in said logic array to receive multiple bits of data; and
   c) means for selecting said number of said storage devices;
   whereby said accessing substantially changes an amount of current used by said accessed storage device without substantially changing an amount of current used by any unaccessed storage device in said logic array.

2. The logic array of claim 1 wherein said means for accessing a selected number of said storage devices to receive multiple bits of data comprises:
   a) means for addressing a storage location by specifying an x coordinate and a y coordinate, the same x-y coordinate point on every subarray of every storage device being addressed simultaneously thereby; and
   b) multiple primary signals wherein each said storage device has an associated unique primary signal such that by enabling one of said primary signals multiple data bits, one from each subarray of a single storage device, can be selected.

3. The logic array of claim 2 wherein means for addressing a storage location comprises address signals whereby address bits on said address signals include said x and y coordinates.

4. The logic array of claim 1 wherein said accessing changes the current used by any unaccessed storage device in said logic array by less than 5%.

5. A memory array for storing data bits comprising:
   a) a plurality of random access memories (RAMs) wherein each RAM comprises multiple data out signals and a plurality of subarrays, the number of subarrays on each RAM corresponding to the number of data out signals on said RAM, and each subarray comprising a plurality of memory cells wherein each memory cell in one of said subarrays has a unique coordinate, said coordinates repeated across subarrays and across RAMs, wherein accessing data bits from said memory cells results in a significant increase in consumption of current by that RAM;
   b) means for accessing a selected number of said RAMs in said memory array to receive multiple data bits; and
   c) means for selecting said number of said RAMs;
   whereby said accessing substantially changes an amount of current used by said accessed RAM without substantially changing an amount of current used by any unaccessed RAM in said memory array.

6. The memory array of claim 5 wherein said means for accessing a selected number of said RAMs to receive multiple data bits comprises:
   a) means for addressing a memory cell by specifying an x coordinate and a y coordinate, the same x-y coordinate point on every subarray of every RAM being addressed simultaneously thereby; and
   b) multiple primary signals wherein each said RAM has an associated unique primary signal such that by enabling one of said primary signals multiple data bits, one from each subarray of a single RAM, can be selected.

7. The memory array of claim 6 wherein means for addressing a memory cell comprises address signals whereby address bits on said address signals include said x and y coordinates.

8. The memory array of claim 5 wherein said accessing changes the current used by any unaccessed RAM in said memory array by less than 5%.

9. A logic memory array for storing bits of information, comprising:
   a) a plurality of storage devices wherein each storage device comprises multiple data out signals and a plurality of subarrays, the number of subarrays on each storage device corresponding to the number of data out signals on said storage device, and each subarray comprising a plurality of storage locations wherein each storage location in one of said subarrays has a unique x-y coordinate, said coordinates repeated across subarrays and across storage devices, wherein accessing data from said storage locations results in a significant increase in consumption of current by that storage device; and
   b) a second device connected to said storage devices such that the bits of information are transferrable between said storage devices and said second device in a plurality of parallel processes, said second device having means for individually accessing each of said storage devices to obtain a number of the bits of information from said storage device which results in a substantial increase in current consumption by the accessed storage unit, without substantially changing the current to any unaccessed storage units;
   wherein said means for accessing each of said storage devices includes plural primary signals, with one primary signal to each of said storage devices, and a common secondary signal to each of said storage devices, said primary signal selecting a single x coordinate from its associated storage device and said secondary signal selecting a y coordinate from said storage devices.

* * * * *